United States Patent
Nitschke et al.

(10) Patent No.: US 6,853,306 B1
(45) Date of Patent: Feb. 8, 2005

(54) CIRCUIT ARRANGEMENT FOR MEASURING THE RESISTANCE OF RESISTORS IN A PRESSURE-SENSITIVE RESISTOR MAT

(75) Inventors: Werner Nitschke, Ditzingen (DE); Jochen Seibold, Tuebingen (DE); Thomas Mager, Pfullingen (DE); Hermann Maier, Markgroeningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/936,034

(22) PCT Filed: Feb. 25, 2000

(86) PCT No.: PCT/DE00/00535

§ 371 (c)(1),
(2), (4) Date: Dec. 21, 2001

(87) PCT Pub. No.: WO00/54064

PCT Pub. Date: Sep. 14, 2000

(30) Foreign Application Priority Data

Mar. 9, 1999 (DE) .......................................... 199 10 194

(51) Int. Cl.[7] .............................................. G08B 21/00
(52) U.S. Cl. ........................ 340/667; 340/665; 340/666
(58) Field of Search ................................ 340/667, 330, 340/326, 665, 666, 426; 324/522, 713, 537, 718; 280/730, 734, 735

(56) References Cited

U.S. PATENT DOCUMENTS 4,374,384 A * 2/1983 Moates ................... 340/870.38
4,725,816 A * 2/1988 Petterson ................... 340/365
5,612,876 A * 3/1997 Zeidler et al. ............... 340/667
5,640,095 A * 6/1997 Beier et al. .................. 324/552

FOREIGN PATENT DOCUMENTS

EP          0 791 834          8/1997

OTHER PUBLICATIONS

T. D'Alessio, "Measurement Errors in the Scanning of Piezoresistive Sensors Arrays", Sensors and Actuators A, CH, Elsevier, Lausanne, vol. 72, No. 1, Jan. 8, 1999, pp. 71–76.X.

* cited by examiner

Primary Examiner—Jeffery Hofsass
Assistant Examiner—Hung Nguyen
(74) Attorney, Agent, or Firm—Kenyon & Kenyon

(57) ABSTRACT

The resistances of resistors arranged in a matrix form in a pressure-sensitive resistor mat are measured with high accuracy and using simple circuitry by the fact that the output of an operational amplifier is connected to each row conductor and each column conductor, which are connected to the resistor. A voltage is selectively applied to the individual resistors by appropriately activating the operational amplifiers. Each operational amplifier associated with the row or column conductors is equipped with a current balancing circuit which detects the output current of the operational amplifier connected to the selected resistor which flows through this resistor. A processor determines the individual resistance values from the currents flowing through the individual resistors and the voltage drops across those resistors.

5 Claims, 2 Drawing Sheets

CIRCUIT ARRANGEMENT FOR MEASURING THE RESISTANCE OF RESISTORS IN A PRESSURE-SENSITIVE RESISTOR MAT

FIELD OF THE INVENTION

The present invention relates to a circuit arrangement for measuring the resistance of resistors arranged in a matrix form in a pressure-sensitive resistor mat arranged in a vehicle seat for detecting seat occupancy.

BACKGROUND INFORMATION

A resistor mat having a plurality of pressure-sensitive resistor elements is described in German Patent No. 42 37 072. Such a resistor mat is integrated in the vehicle seat, for example in the front passenger seat, in order to automatically detect seat occupancy. Whether or not the airbag belonging to the front passenger seat is to be deployed in the event of a crash or what inflating intensity is desirable basically depends on the occupancy of the front passenger seat. If no occupancy or a child's seat is sensed on the vehicle seat by the resistor mat, the deployment of the airbag is to be completely suppressed. The same is true if the front passenger seat is occupied not by a person but by an object (e.g., a piece of baggage). The intensity of inflation depends on the size of the person occupying the vehicle seat, which is expressed by his or her weight, which can be measured using the resistor mat. The resistor mat can also provide information on the seating position of the person, which should affect the inflation intensity of the airbag. The more accurately the resistances of the pressure-sensitive resistors arranged in the resistor mat in a matrix form can be measured, the more accurate the information on the type of occupancy or seating position of a person on the vehicle seat.

An object of the present invention is to provide a circuit arrangement which performs an accurate resistance measurement of the individual resistors arranged in a matrix form in a pressure-sensitive resistor mat with the lowest possible circuit complexity.

In an article by T. D'Alessio, "Measurement Errors in the Scanning of Piezoresistive Sensor Arrays," Sensors and Actuators A, CH, Elsevier, Lausanne, Vol. 72, No. 1, Jan. 8, 1999, pp. 71–76, different circuits are shown for activating piezoresistive sensors in a matrix. The outputs of buffers, for which operational amplifiers can be used, are connected to the columns and rows.

European Patent Application No. 791 834 describes a method for determining the resistance of a resistor arrangement, in which leakage current is generated by applying voltage potentials of the same value. Furthermore, a measurement of the quantities required for determining the resistance value is performed by applying a first and a second voltage potential having different potential values to obtain a test current flowing through the resistor. These voltage potentials are selected so that the direction of the test current coincides with the direction of the cover current. Subsequently, the adjusted terminal voltages and a test current are measured. The resistance value is calculated using the measured values of the leakage current, test current, and terminal voltage.

SUMMARY

In accordance with an example embodiment of the present invention, a resistor matrix includes row conductors and column conductors, each row conductor being connected to each column conductor via a resistor. Each row conductor and each column conductor is connected to the output of an operational amplifier, so that a voltage can be selectively applied to the individual resistors in the rows and columns by appropriately activating the operational amplifiers. Each operational amplifier associated with the row conductors or column conductors is equipped with a current balancing circuit which detects the output current of the operational amplifier connected to the selected resistor which flows through this resistor. A processor determines the resistance values from the currents flowing through the individual resistors and the voltage drops across these resistors. The current balancing circuits in the operational amplifiers allow the current flowing through the individual resistors to be measured very accurately without requiring extremely narrow tolerances for the circuit elements.

The current balancing circuit may include, for example, an adder which adds the current flowing from an output stage of the operational amplifier to its supply voltage source and the current flowing from the output stage to ground, so that the output current of the operational amplifier flowing through the selected resistor can be picked up at the output of the adder. A circuit arrangement is advantageously provided in the current balancing circuit for transforming the two currents supplied to the adder into another measured value range. It is advantageous for the evaluation of the measured currents, which may scatter very widely due to the large changes in resistance, if the measured currents are transformed into a narrow measured value range.

It is expedient that the resistors in one column and in one row of the resistor matrix have fixed, pressure-independent resistances to allow defects of the row conductors and column conductors to be diagnosed. These resistors having pressure-independent resistances are preferably arranged in one column and one row at the edge of the resistor mat, since pressure-sensitive resistors are less needed at the edge of the vehicle seat than on the seat surface, which is the actual measuring surface.

DETAILED DESCRIPTION

Figure 1:
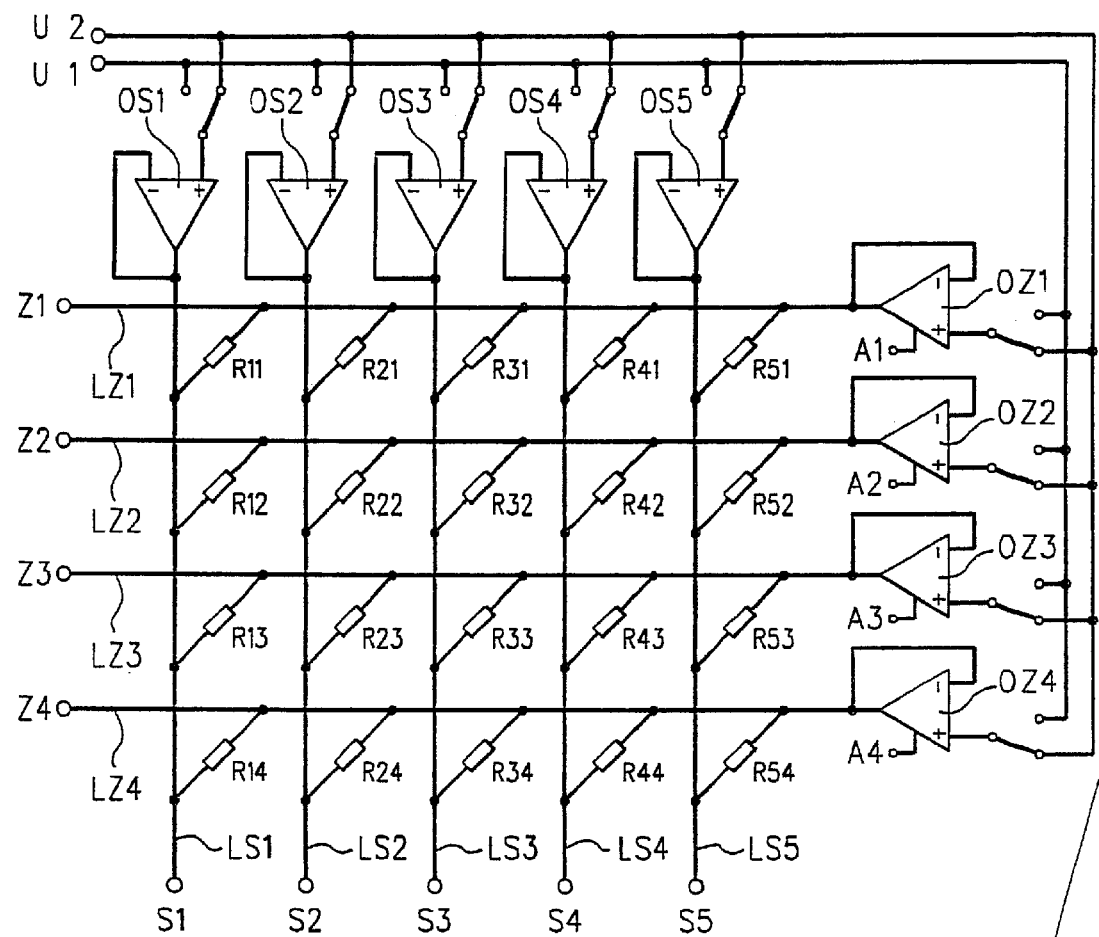
FIG. 1 shows a resistor matrix.
Figure 1:
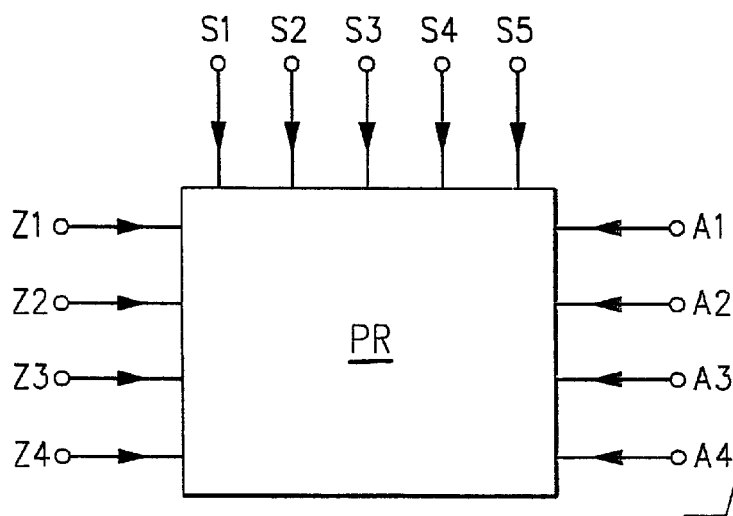

FIG. 1 shows a circuit diagram of a resistor matrix as it is used in a pressure-sensitive resistor mat arranged in a vehicle seat for detecting seat occupancy. The resistor matrix has row conductors and column conductors, which are all connected to one another via pressure-sensitive resistors. In the embodiment illustrated, there are four row conductors LZ1, LZ2, LZ3, LZ4 and five column conductors LS1, LS2, LS3, LS4, LS5. There are resistors Rsz, s being the column index (s=1, 2, 3, 4, 5) and z being the row index (z=1, 2, 3, 4). For example, resistor R11 connects first column conductor LS1 to first row conductor LZ1; resistor R32 connects third column conductor LS3 to second row conductor LZ2; resistor R54 connects fifth column conductor LS5 to fourth row conductor RZ4, etc. Thus, a matrix of s*z resistors is obtained, which are distributed over the entire seat surface and respond to pressure exerted in the zones of the seat surface assigned to the individual resistors with a change in resistance. In order to detect the change in resistance which is proportional to the pressure for all resistors in the matrix, the measuring circuit described below is used.

Each column conductor LS1, LS2, LS3, LS4, LS5 is connected to the output of an operational amplifier OS1, OS2, OS3, OS4, and OS5. Similarly, each row conductor LZ1, LZ2, LZ3, LZ4 is connected to the output of an operational amplifier OZ1, OZ2, OZ3, OZ4. Each of these operational amplifiers OS1, . . . , OS5 and OZ1, . . . , OZ4 has a first input feedback connected to the output and a second input which can be connected to a voltage U1 or a voltage U2 via a switch. The two voltages U1 and U2 are different; for example, voltage U1=5 V and U2=2.5 V. There is a processor PR, which switches operational amplifiers OS1, . . . , OS5 for the columns and operational amplifiers OZ1, . . . , OZ4 for the rows consecutively to voltage U1 or U2 so that a voltage is applied consecutively to all resistors Rsz of the resistor matrix. In the initial condition, operational amplifiers OS1, . . . , OS5 for column conductors LS1, . . . , LS5 as well as operational amplifiers OZ1, . . . , OZ4 for row conductors LZ1, . . . , LZ4 are switched to the same voltage U2. Then, both terminals of each resistor Rsz are at the same potential, and there is no voltage drop across them, and therefore they are conducting no current. Then, operational amplifier OS1 for first column conductor LS1 is switched over to the other voltage U1. All the other operational amplifiers continue to be at voltage U2. Due to the voltage switch-over . . . , of operational amplifier OS1, both terminals of resistors R11, R12, R13, and R14 in the first column are at different potentials, namely U1 and U2, so that there is a voltage drop across them and they also conduct a current. After the currents flowing through these resistors and the voltage drop across them have been measured, as will be described in more detail below, and the resistance values have been calculated therefrom by processor PR, operational amplifier OS1 of first column conductor LS1 is switched over again to voltage U2 and operational amplifier OS2 of second column conductor LS2 is switched over to voltage U1. Then, the resistance values of resistors R21, R22, R23, and R24 can be determined. Thus, the resistances are measured in all columns.

In order to measure the individual resistances in the matrix, the voltage applied to the respective resistor and the current flowing through it is measured. The voltage drop across each resistor is determined by processor PR, to which is connected outputs S1, S2, S3, S4, and S5 of column conductors LS1, LS2, LS3, LS4, and LS5 and outputs Z1, Z2, Z3, and Z4 of row conductors LZ1, LZ2, LZ3, and LZ4. The currents through the individual resistors are detected by operational amplifiers OZ1, OZ2, OZ3, and OZ4 connected to row conductors LZ1, LZ2, LZ3, and LZ4. The currents through the resistors could also be detected via operational amplifiers OS1, OS2, OS3, OS4, and OS5 associated with column conductors LS1, LS2, LS3, LS4, and LS5. The current that flows through a resistor flows through the row conductor connected to the respective resistor and appears as an output current at the operational amplifier connected to this row conductor.

Figure 2:
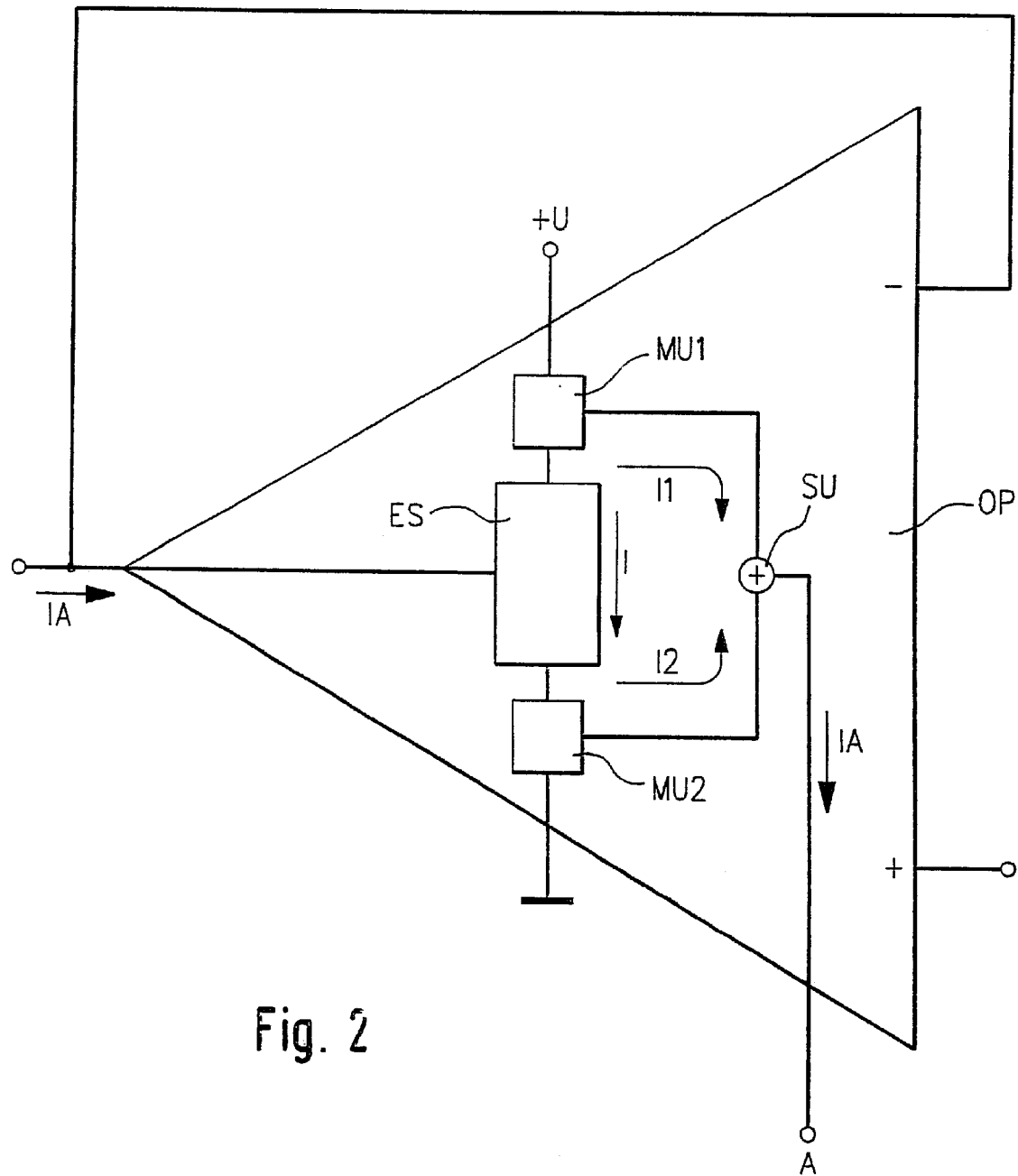
FIG. 2 shows an operational amplifier which detects the currents flowing through the resistors.

Each operational amplifier OZ1, OZ2, OZ3, and OZ4 associated with the row conductors is provided, according to the embodiment illustrated in FIG. 2 of an operational amplifier OP, with a current balancing circuit which is capable of detecting output current IA of operational amplifier OP, which is exactly equal to the current flowing through the resistor which is about to be measured. Output current IA flows into output stage ES of operational amplifier OP. The design of output stage ES will not be described here in detail, since it is a conventional circuit for operational amplifiers that is well known to those skilled in the art. Output stage ES is normally connected to a positive supply voltage +U and to ground. The current balancing circuit operates by tapping both current I1 flowing from output stage ES to supply voltage source +U and current I2 flowing from output stage ES to ground. If current IA flowing into output stage ES is positive, the equation I2 =−(I +IA) applies to the current flowing to ground, I being the cross current flowing through the output stage. The equation I1 =I applies to the current flowing to supply voltage source +U. If current IA flowing at the output of output stage ES has a negative sign, the equation I1 =I +IA applies to current I1 and the equation I2=−I applies to current I2. In order to detect output current IA alone, which corresponds to the current flowing through the resistor to be measured, independently of cross current I in output stage ES, the two currents I1 and I2 are supplied to an adder SU. By adding the two currents I1 and I2, cross current I of output stage ES is eliminated and only desired output current IA appears at output A of adder SU.

Since the values of the pressure-sensitive resistors fluctuate between 1 kΩ and 2 MΩ, current IA flowing through the individual resistors can also change over a very wide measurement range of approximately 5 $\mu$A to 5 m A. If this extremely wide range of currents is to be transformed into a narrower current range, which would facilitate the evaluation of the measured currents in processor PR, circuit arrangements MU1 and MU2 are provided, using which the two currents I1 and I2 supplied to adder SU are transformed into a limited defined current range of approximately 250 $\mu$A. Such conventional circuit arrangements for measured value transformation are known per se and include a plurality of attenuating and amplifying stages.

As FIG. 1 shows, outputs A1, A2, A3, and A4 of operational amplifiers OZ1, OZ2, OZ3, and OZ4 associated with the rows, which provide the currents through the resistors, are connected to processor PR. Instead of currents at outputs A1, A2, A3, and A4, appropriate measuring voltages can also be supplied to processor PR. The measuring voltage of each operational amplifier can be obtained through a resistor connected to the output of adder SU and traversed by output current IA.

In order for defects in the resistor mat, for example, broken conductors, to be diagnosed, the resistors in one column and in one row have fixed, pressure-independent resistances. These pressure-independent resistors are preferably in one column and in one row at the edge of the resistor mat. In the embodiment shown, these are resistors R11, R12, R13, R14, R24, R34, R44, R54. Due to the fact that the pressure-independent resistors are located at the edge of the resistor mat, i.e., outside the actual seat surface, the pressure-sensitive measuring surface is not reduced.

What is claimed is:

1. A circuit arrangement for measuring the resistances of resistors configured in a matrix form in a pressure-sensitive resistor mat arranged in a vehicle seat for detecting seat occupancy, the matrix including row conductors and column conductors, each row conductor being connected to each column conductor via a resistor, the circuit arrangement comprising:

operational amplifiers, each of the row conductors and each of the column conductors connected to an output of a respective one of the operational amplifiers, a voltage being selectively appiled to an individual one a voltage can be selectively applied to the individual one of the resistors by activating at least one of the operational amplifiers when the one of the operational amplifiers is activated, the detected output current flowing through the individual one of the resistors; and a processor configured to determine a resistance value from the detected output current flowing through the individual one of the resistors and a voltage drop across the individual one of the resistors.

2. The circuit arrangement according to claim 1, wherein the current balancing circuit of each one of the operational amplifiers includes an adder that adds a current at an output stage of the one of the operational amplifiers to a supply voltage source and a current flowing through the output stage to ground to provide the output current flowing through the individual one of the resistors at an output of the adder.

3. The circuit arrangement according to claim 2, wherein the current balancing circuit includes a transform circuit configured to transform the current at the output stage of one of the operational amplifiers and the current flowing through the output stage to ground provided to the adder into another measured value range.

4. The circuit arrangement according to claim 1, wherein the resistors in one column and in one row of the matrix have fixed, pressure-independent resistance.

5. The circuit arrangement according to claim 4, wherein the resistors having fixed, pressure-independent resistance are located at an edge of the resistor mat.

* * * * *